(12) United States Patent
Hsu et al.

(10) Patent No.: US 10,636,701 B2
(45) Date of Patent: Apr. 28, 2020

(54) METHODS OF FORMING SEMICONDUCTOR DEVICES USING MULTIPLE PLANARIZATION PROCESSES

(71) Applicant: Taiwan Semiconductor Manufacturing Company, Ltd., Hsinchu (TW)

(72) Inventors: Chun-Wei Hsu, Hsinchu (TW); Ling-Fu Nieh, Taipei (TW); Pinlei Edmund Chu, Hsinchu (TW); Chi-Jen Liu, Taipei (TW); Yi-Sheng Lin, Taichung (TW); Ting-Hsun Chang, Kaohsiung (TW); Chia-Wei Ho, Kaohsiung (TW); Liang-Guang Chen, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 15/939,894

(22) Filed: Mar. 29, 2018

(65) Prior Publication Data
US 2019/0103308 A1    Apr. 4, 2019

Related U.S. Application Data

(60) Provisional application No. 62/565,919, filed on Sep. 29, 2017.

(51) Int. Cl.
*H01L 21/768* (2006.01)
*H01L 23/532* (2006.01)
*H01L 23/522* (2006.01)

(52) U.S. Cl.
CPC .. *H01L 21/76819* (2013.01); *H01L 21/76802* (2013.01); *H01L 21/76808* (2013.01);
(Continued)

(58) Field of Classification Search
CPC .......... H01L 21/7684; H01L 21/76819; H01L 21/76877; H01L 21/76802;
(Continued)

(56) References Cited

U.S. PATENT DOCUMENTS 6,562,719 B2   5/2003   Kondo et al.
6,818,546 B2   11/2004  Saito et al.
(Continued)

FOREIGN PATENT DOCUMENTS

JP   H08298285 A   11/1996
JP   2010251492 A  11/2010
(Continued)

*Primary Examiner* — Thanh Y. Tran
(74) *Attorney, Agent, or Firm* — Slater Matsil, LLP

(57) ABSTRACT

Semiconductor devices and methods of forming are provided. In some embodiments the method includes forming a dielectric layer over a substrate and patterning the dielectric layer to form a first recess. The method may also include depositing a first layer in the first recess and depositing a second layer over the first layer, the second layer being different than the first layer. The method may also include performing a first chemical mechanical polish (CMP) process on the second layer using a first oxidizer and performing a second CMP process on remaining portions of the second layer and the first layer using the first oxidizer. The method may also include forming a first conductive element over the remaining portions of the first layer after the second CMP polish is performed.

20 Claims, 16 Drawing Sheets

(52) U.S. Cl.
CPC .... *H01L 21/76877* (2013.01); *H01L 23/5226* (2013.01); *H01L 23/53252* (2013.01)

(58) Field of Classification Search
CPC ......... H01L 21/76897; H01L 21/76849; H01L 21/76843; H01L 23/5226; H01L 23/53252
See application file for complete search history.

(56) References Cited

U.S. PATENT DOCUMENTS

| | | | |
|---|---|---|---|
| 2004/0132281 A1* | 7/2004 | Ingerly | H01L 21/76808 438/638 |
| 2006/0216930 A1* | 9/2006 | Feng | H01L 21/76877 438/637 |
| 2010/0035433 A1 | 2/2010 | Takemiya et al. | |
| 2013/0092651 A1* | 4/2013 | Bates | C09K 3/1463 216/13 |
| 2017/0040208 A1* | 2/2017 | Choi | H01L 21/7684 |

FOREIGN PATENT DOCUMENTS

| | | |
|---|---|---|
| KR | 20050001188 A | 1/2005 |
| TW | 483105 B | 4/2002 |
| TW | 503476 B | 9/2002 |
| WO | 2008132983 A1 | 11/2008 |

* cited by examiner

METHODS OF FORMING SEMICONDUCTOR DEVICES USING MULTIPLE PLANARIZATION PROCESSES

PRIORITY CLAIM

This patent application claims priority to U.S. Provisional Application No. 62/565,919, filed Sep. 29, 2017, which is hereby incorporated herein by reference in its entirety.

BACKGROUND

In the current process of miniaturizing semiconductor devices, low-k dielectric materials are desired as the inter-metal and/or inter-layer dielectric between conductive interconnects in order to reduce the resistive-capacitive (RC) delay in signal propagation due to capacitive effects. As such, the lower the dielectric layer constant of the dielectric, the lower the parasitic capacitance of adjacent conductive lines and the lower the RC delay of the integrated circuit (IC).

However, the materials that are currently being considered or used as low-k dielectric materials are not ideal. In particular, in choosing a material based upon its k-value, and particularly based upon its low-k value, other characteristics, such as the hardness of the material or its strength, may not be ideal for use in a semiconductor manufacturing process. As such, improvements in processes that utilize low-k dielectric materials are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
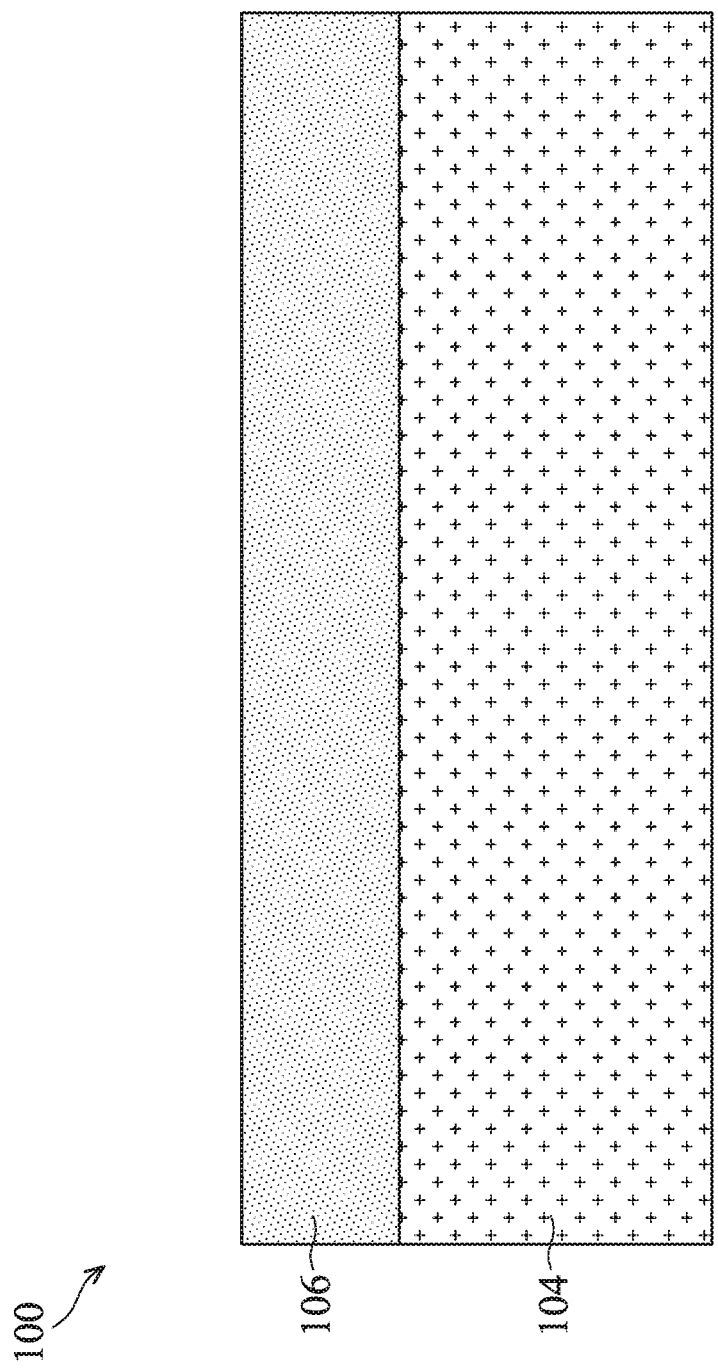
FIGS. 1 through 16 illustrate intermediate stages in the forming of a semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1 through 16 illustrate cross-sectional views and/or plan views of intermediate stages in the formation of a semiconductor device 100 in accordance with some embodiments. In accordance with some embodiments, an interconnect structure may be formed over a substrate. The interconnect structure may include one or more conductive features, for example conductive lines, active devices, passive devices and/or dummy devices. A method of forming a conductive feature may include overfilling a recess and then thinning the overfilled recess to a desired thickness, for example using a chemical mechanical polishing (CMP) process. In some embodiments, the conductive features may be formed using a metal that is relatively expensive. For example, the conductive features may be formed using ruthenium. If a relatively expensive metal is used, the overfilling and subsequent thinning may waste expensive metal and increase costs. Additionally, the conductive features may be formed using a metal that is relatively difficult to CMP. For example, to efficiently CMP ruthenium, it may be necessary to use a strong oxidizer, which may create gases that are harmful if inhaled by humans. If a weak oxidizer is used to CMP ruthenium, the manufacturing process may be safer, but the time for the CMP process may be undesirably lengthy.

In accordance with some embodiments, a two layer process may be used to form conductive features in a dielectric layer of an interconnect region. The first layer is formed in a recess of a dielectric layer in which a conductive feature will be formed, where the first layer includes a material composition that is desired for the conductive feature to be made of. A second layer may be formed over the first layer, where the second layer has a material composition that may be less expensive than a material composition of the first layer, and/or that is easier to CMP than a material composition of the first layer. A plurality of CMP processes may be performed to thin the second layer, the first layer, and the dielectric layer to a desired thickness. Because of the presence of the second layer, at least one of the CMP processes is performed substantially on the second layer instead of the first layer, which may result in less expensive metal being wasted and/or may proceed more efficiently using only a relatively weak oxidizer, which may improve manufacturing safety and/or save time.

Referring to FIG. 1, semiconductor device 100 includes semiconductor substrate 104. Semiconductor substrate 104 may be formed of a semiconductor material such as silicon, doped or undoped, or an active layer of a semiconductor-on-insulator (SOI) substrate. The semiconductor substrate 104 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices (not illustrated), such as transistors, diodes, capacitors, resistors, etc., may be formed in and/or on an active surface of semiconductor substrate 104.

FIGS. 1 through 16 depict intermediate stages in the forming of an interconnect structure over semiconductor substrate 104. Dielectric layer 106 is formed on semiconductor substrate 104. In some embodiments, dielectric layer 106 is an interlayer dielectric (ILD). Dielectric layer 106 may be formed of a polymer, which may be a photosensitive material such as polybenzoxazole (PBO), polyimide, benzocyclobutene (BCB), a combination thereof, or the like, that may be patterned using lithography. In other embodiments, dielectric layer 106 is formed of a nitride such as silicon nitride, an oxide such as silicon oxide, PhosphoSilicate Glass (PSG), BoroSilicate Glass (BSG), Boron-doped PhosphoSilicate Glass (BPSG), a combination thereof, or the like. Dielectric layer 106 may be formed by spin coating, lamination, chemical vapor deposition (CVD), or the like.

FIGS. 2 through 15 depict the formation of conductive features that are respectively formed in region 110, region 112, and region 114 (shown in, e.g., FIG. 2) in semiconductor device 100. In accordance with some embodiments, regions 110, 112, and/or 114 may all be located on a same semiconductor device 100, or each of regions 110, 112, and 114 may be located on separate semiconductor devices 100. Although three regions 110, 112, and 114 are illustrated, in some embodiments conductive features may be formed in additional regions or in less regions. When formed in a same semiconductor device 100, regions 110, 112, and 114 may be disposed adjacent to each other or in separate areas of the semiconductor device 100. Conductive features formed in regions 110, 112, and 114 may be a conductive line, an active device, a passive device, a seal ring, an alignment line (such as a scribe line), a dummy device, a combination thereof, or the like. FIGS. 1-16 depict the formation of an SRAM device in region 110, a logic device in region 112, and a seal ring in region 114.

Figure 2:
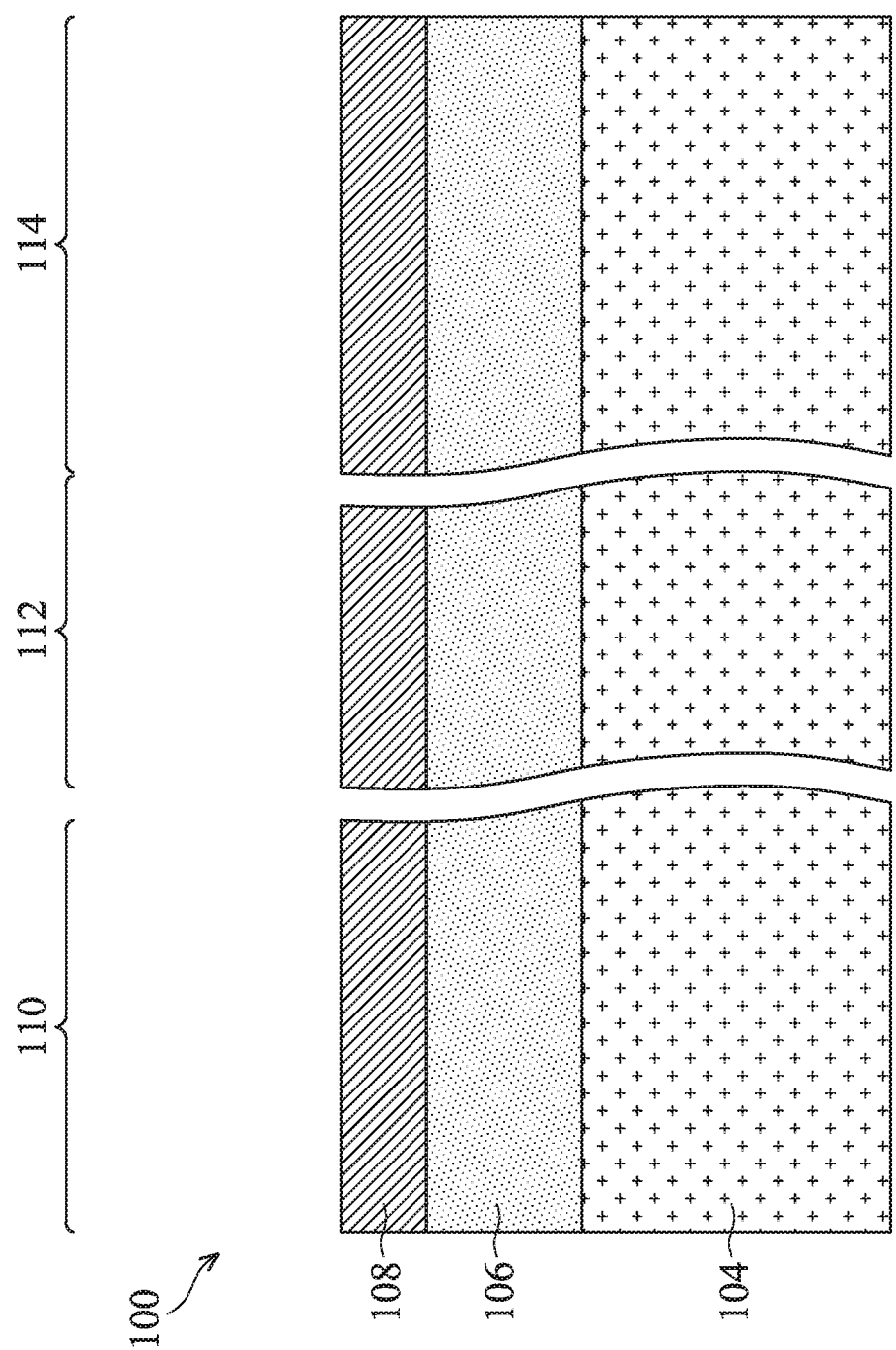

Referring to FIG. 2, mask 108 is formed over dielectric layer 106. In some embodiments, mask 108 is a photoresist, and can be formed by using a spin-on technique. Although a single layer is illustrated, in some embodiments mask 108 may be a trilayer or a bilayer. In other embodiments, mask 108 may be deposited, for example using atomic layer deposition (ALD), chemical vapor deposition (CVD), physical vapor deposition (PVD), or the like. Mask 108 may include silicon nitride, a metal hard mask layer, a combination thereof, or the like.

Figure 3:
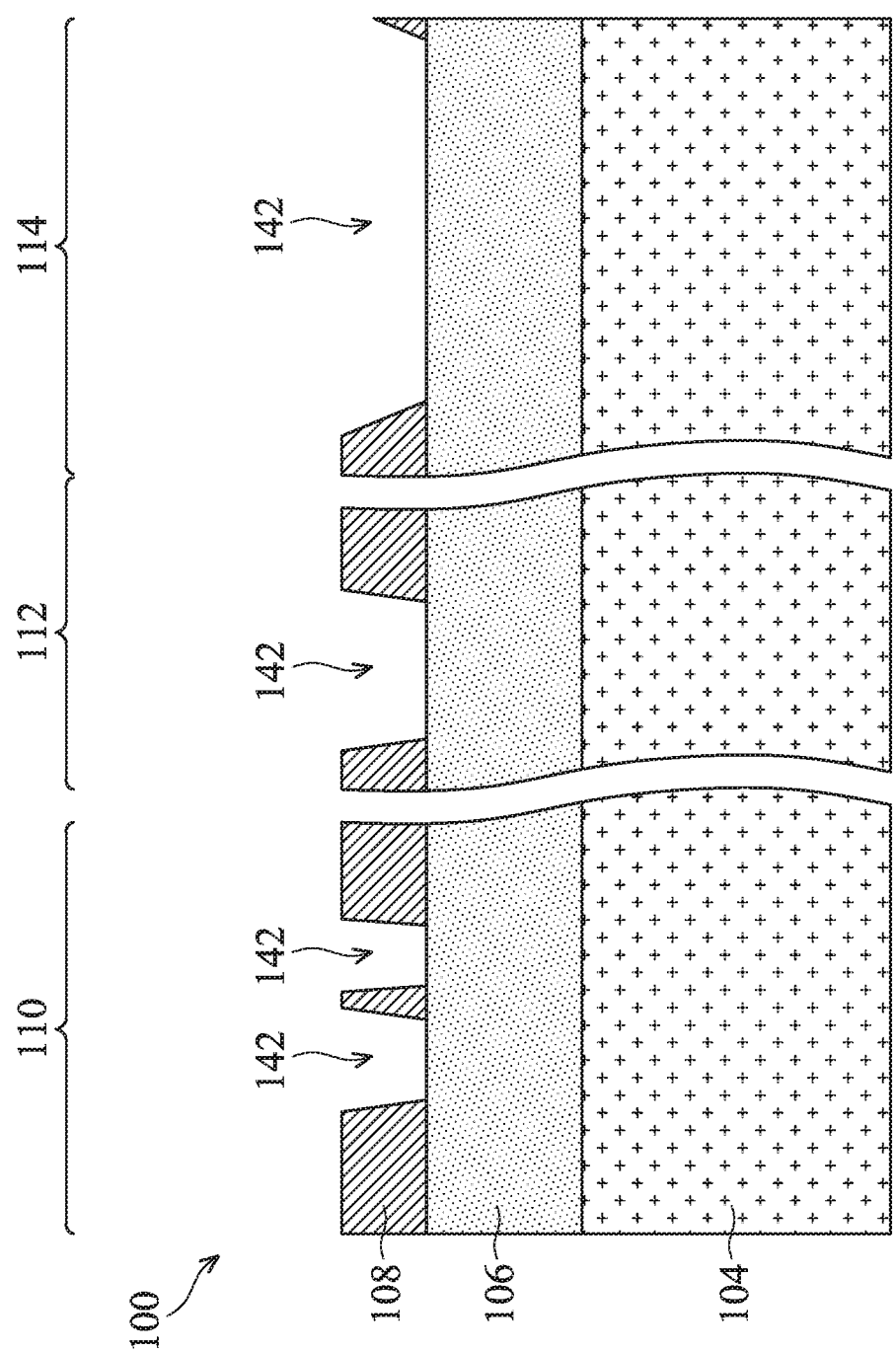

Next, mask 108 is patterned, for example using acceptable photolithography techniques. The resulting structure is shown in FIG. 3. As depicted in FIG. 3, the patterning of mask 108 has formed recesses 142 in mask 108. Portions of dielectric layer 106 are exposed through recesses 142.

Figure 4:
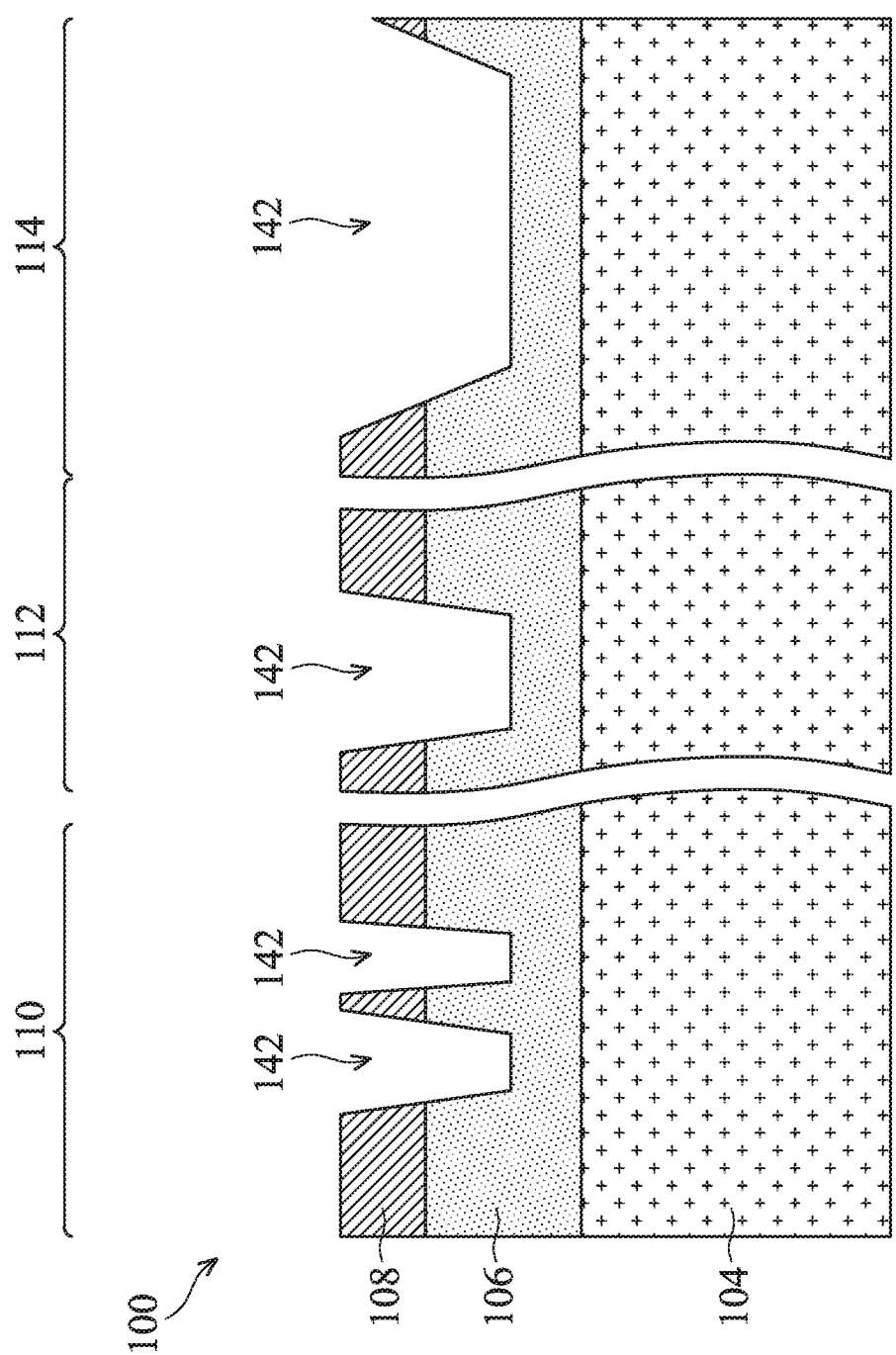

Referring to FIG. 4, the pattern of mask 108 is transferred to dielectric layer 106. An etching process may be performed using mask 108 as an etch mask. The etching may be anisotropic in some embodiments. In accordance with some embodiments, the etching process may be timed, so that after a predetermined time elapses, the etching process terminates and the dielectric layer 106 has been etched a desired amount. After the etching process is completed, the recesses 142 have been extended into dielectric layer 106. In some embodiments, the recesses 142 may penetrate through only a portion of dielectric layer 106, and do not extend completely through dielectric layer 106. After the etching, recesses 142 may have tapered sidewalls.

Figure 5:
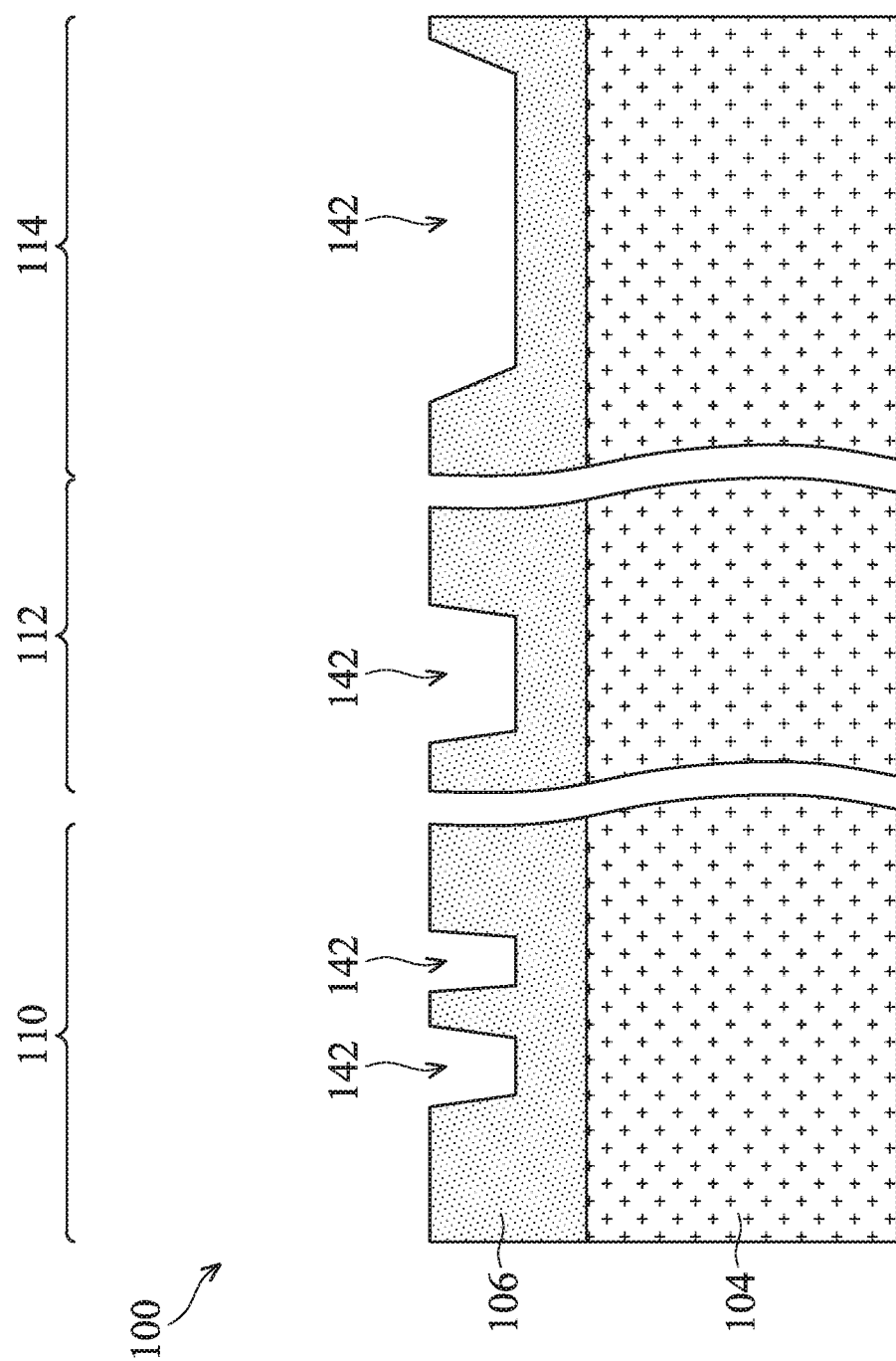

After the etching process is completed, the remaining portions of mask 108 may be removed, for example using an ashing process. The resulting structure is shown in FIG. 5.

Figure 6:
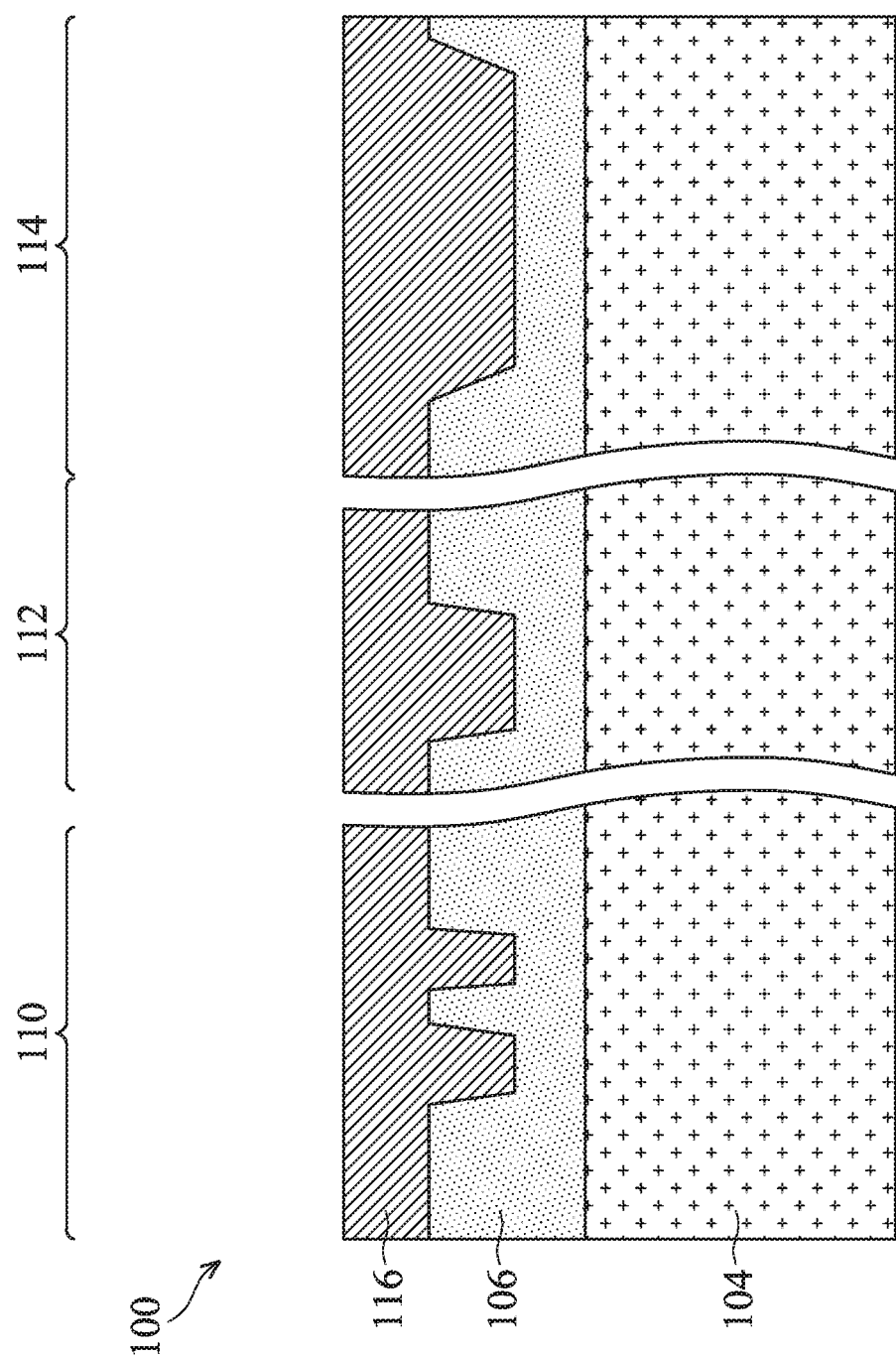

Next, referring to FIG. 6, mask 116 is formed over dielectric layer 106. Mask layer 116 is formed in the recesses 142 in dielectric layer 106. In some embodiments, mask 116 is a photoresist, and can be formed by using a spin-on technique. Although a single layer is illustrated, in some embodiments mask 116 may be a trilayer or a bilayer. In other embodiments, mask 116 may be deposited, for example using ALD, CVD, PVD, or the like. Mask 116 may include silicon nitride, a metal hard mask layer, a combination thereof, or the like.

Figure 7:
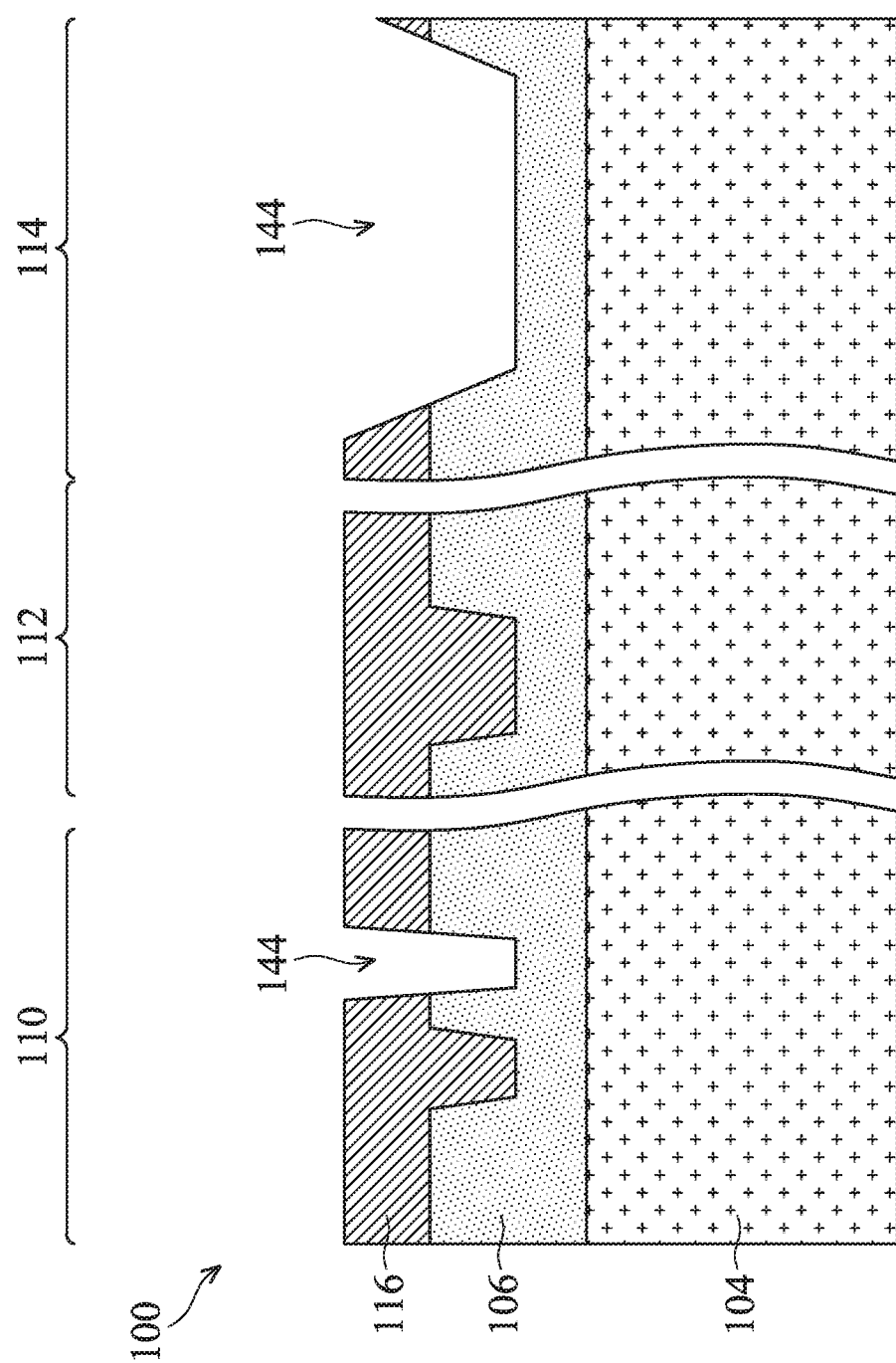

Referring to FIG. 7, mask 116 is patterned, for example using acceptable photolithography techniques. The patterning of mask 116 forms recesses 144. Portions of dielectric layer 106 are exposed through recesses 144.

Figure 8:
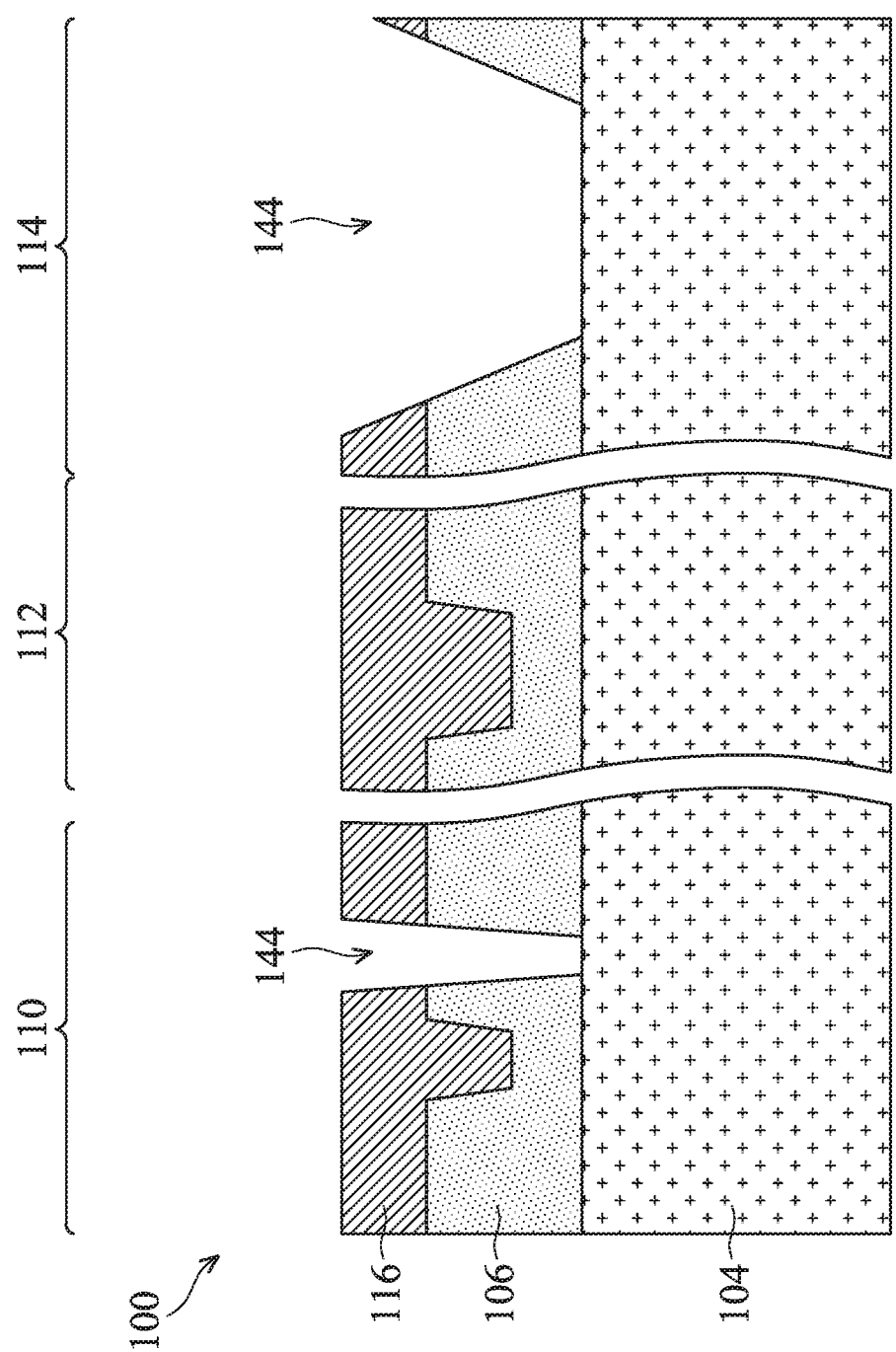

Next, the pattern of mask 116 is transferred to dielectric layer 106. An etching process may be performed using mask 116 as an etch mask. The etching may be anisotropic. In accordance with some embodiments, the etching process may be timed, so that after a predetermined time elapses, the etching process is terminated and the dielectric layer 106 has been etched a desired amount. In other embodiments, the etch process may continue until dielectric layer 106 is etched through and the semiconductor substrate 104 is detected. After the etching process is completed, the recesses 144 have been extended into dielectric layer 106. In some embodiments, the recesses 144 may penetrate through dielectric layer 106 and expose semiconductor substrate 104. After the etching, recesses 144 may have tapered sidewalls. The resulting structure is shown in FIG. 8.

Figure 9:
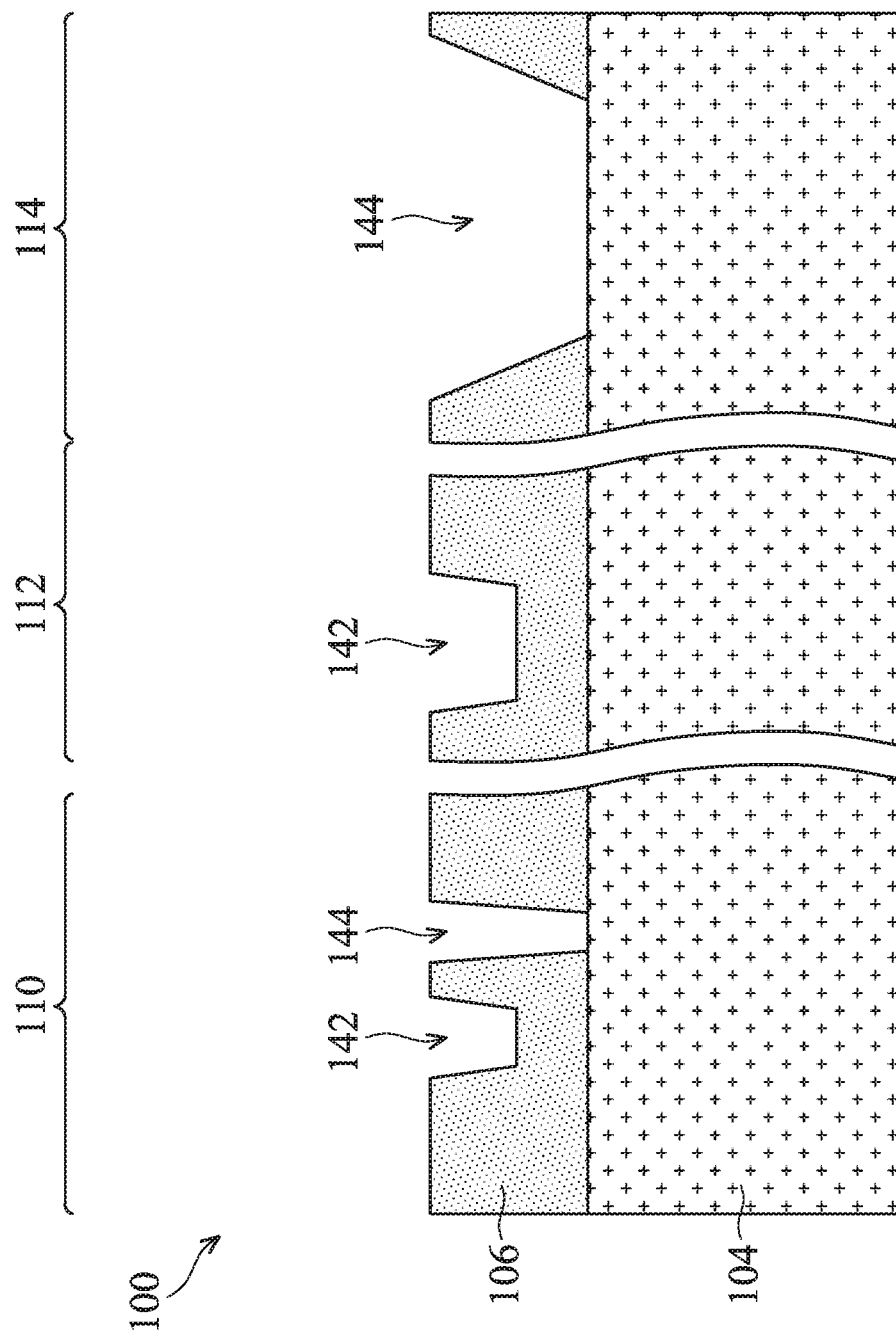

When the etching process terminates, mask 116 may be removed, for example using an ashing process. The resulting structure is depicted in FIG. 9.

Figure 10:
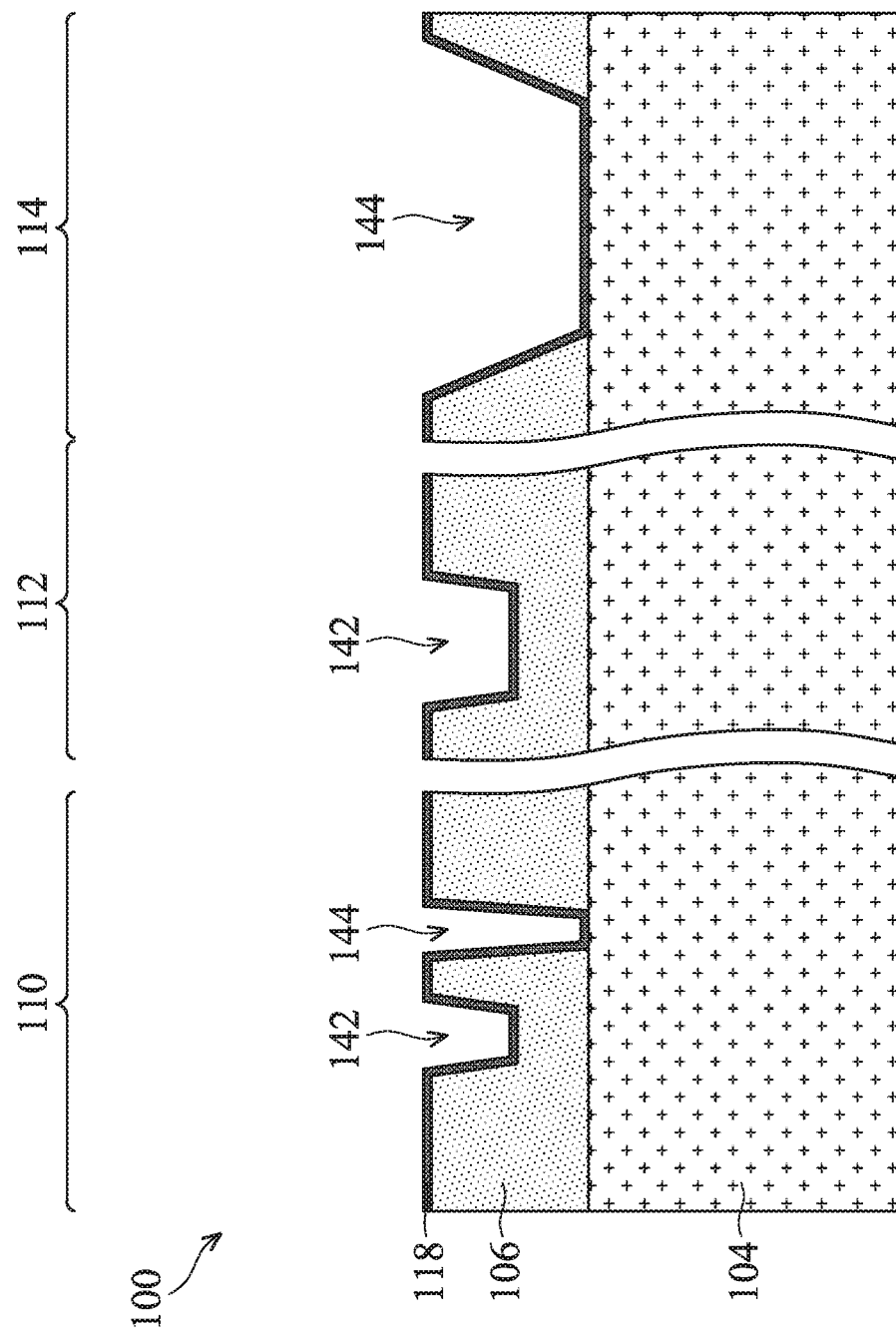

Next, seed layer 118 is formed over dielectric layer 106 and in recesses 142 and 144. In some embodiments, seed layer 118 may comprise copper, although other suitable materials may be used. Seed layer 118 may be formed by a deposition process, such as ALD, PVD, CVD, plasma-enhanced chemical vapor deposition (PECVD), or the like. Seed layer 118 may extend along upper surfaces of dielectric layer 106, along sidewalls of recesses 142 and 144, and bottom surfaces of recesses 142 and 144. The resulting structure is shown in FIG. 10.

Figure 11:
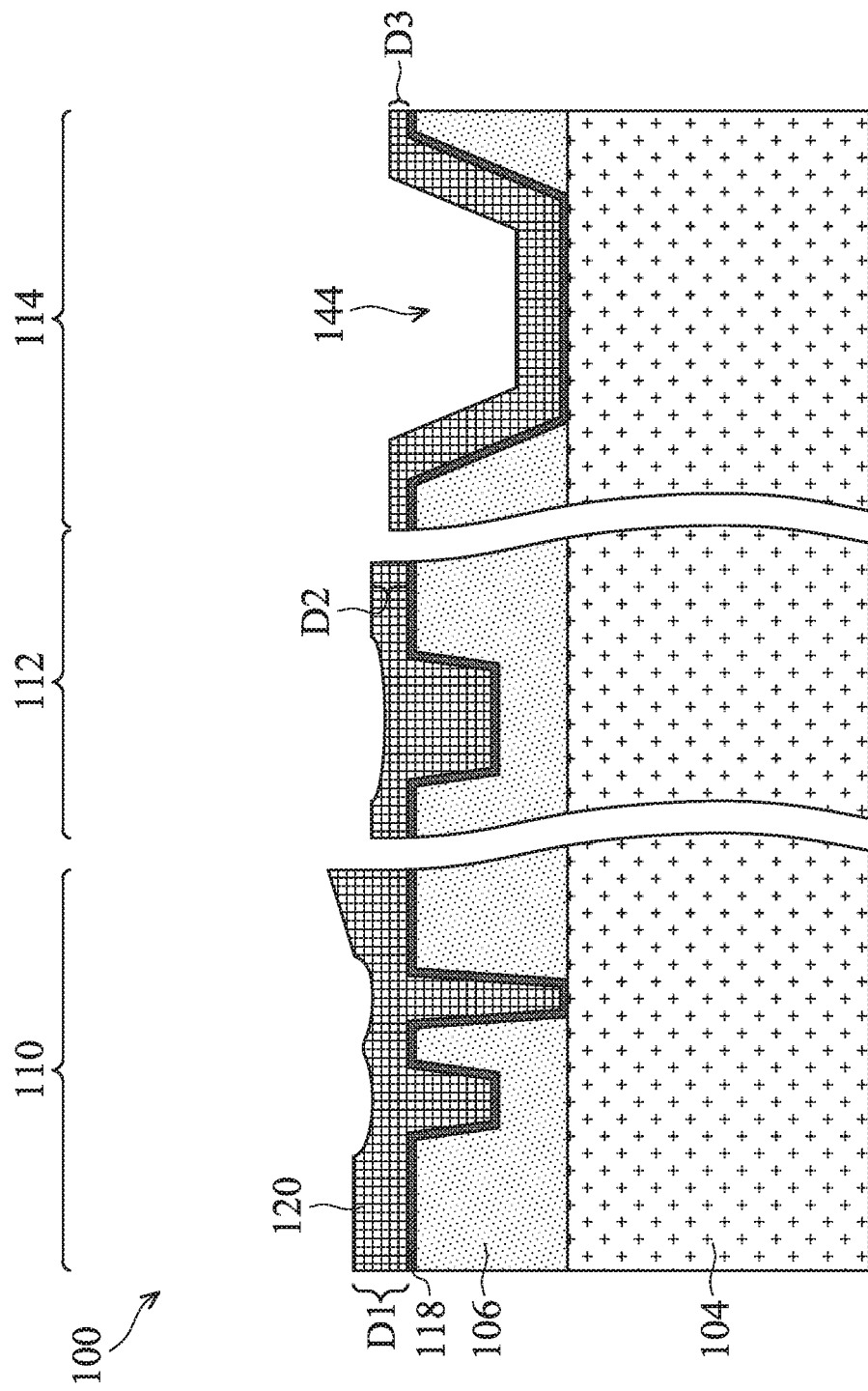
Figure 12:
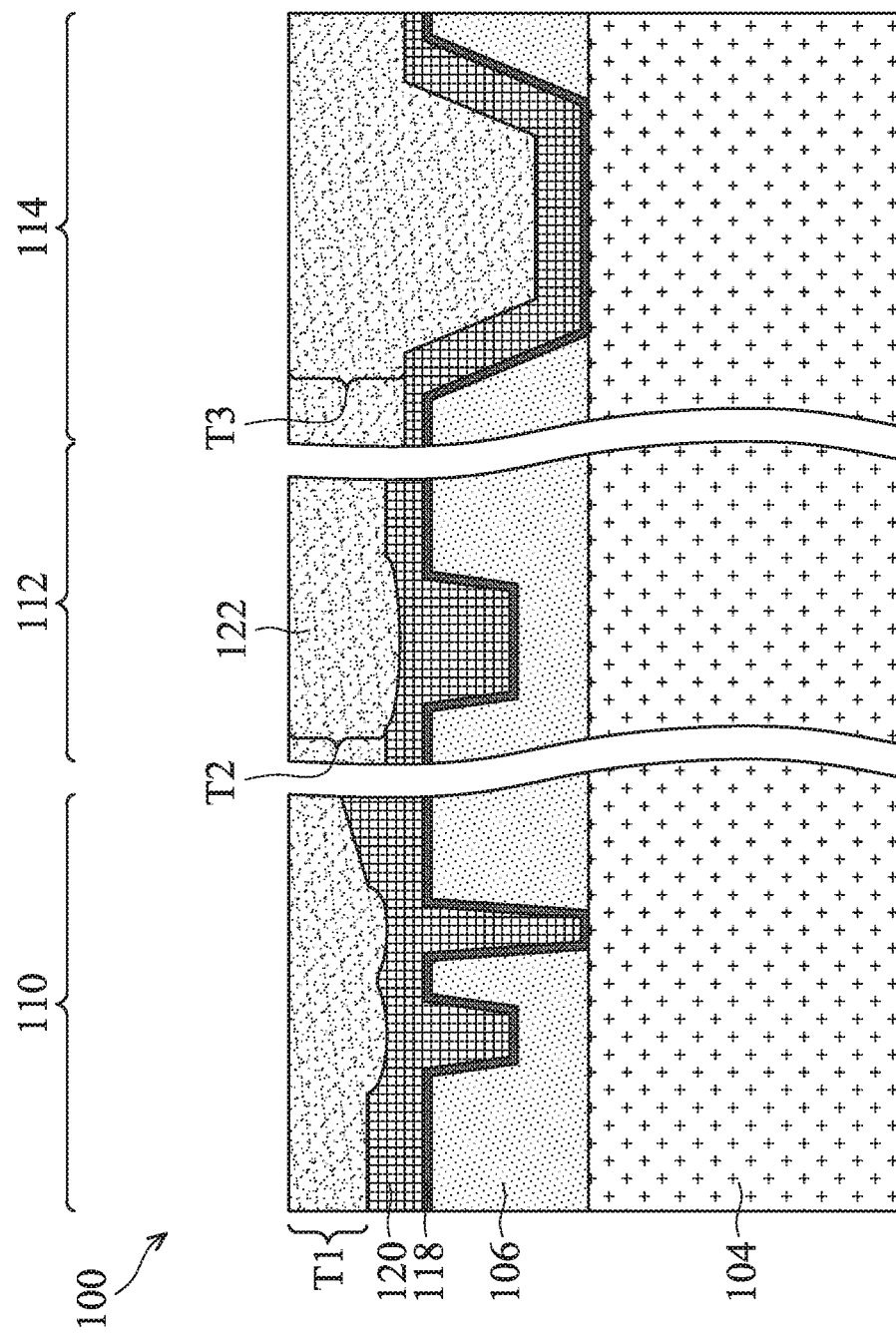

FIGS. 11 and 12 depict the filling and overflowing of recesses 142 and 144 with a first layer 120 and a second layer 122. Some conductive features may be formed by overflowing recesses in a dielectric layer with a conductive material, and then thinning the conductive material and the dielectric layer to a desired size, for example using a chemical mechanical polishing (CMP) process. However, during the CMP process the excess parts of the conductive material, for example portions that overflow the recesses, are removed. If the conductive material is relatively expensive, then the CMP process may waste relatively expensive material. Further, the conductive material that is used may affect the parameters and timing of the thinning process. For example, an oxidizer may be used in the CMP process. If a conductive material is used that is relatively difficult to thin using a CMP process, then a CMP process using a relatively weak oxidizer may take a relatively long time to complete. For example, if ruthenium is used as the conductive material, and $H_2O_2$ is used as the oxidizer, the CMP process may be relatively long. If a strong oxidizer, such as $IO_4$ or $ClO_4$, is used in the CMP process, the process may be completed more quickly. However, the strong oxidizer may create gases (e.g. $RuO_4$) that are harmful to humans, making the manufacturing of the device more hazardous.

In accordance with some embodiments, conductive features may be formed using a two layer process. A first layer 120 may be formed using the conductive material that will be used in the formed conductive features. The first layer 120 may be deposited in recesses of the dielectric layer so that the recesses are filled or partly filled. Next, a second layer 122 (See FIG. 12) is formed over the first layer to a desired thickness. The second layer 122 may be relatively inexpensive and relatively easy to thin using a CMP process compared to first layer 120. As such, during a subsequent CMP process, at least a portion of the material being thinned is the second layer 122 instead of the first layer 120. As such, the waste material that is generated is relatively inexpensive, and the CMP process may proceed relatively faster using only a weak oxidizer, which makes the manufacturing process safer.

Referring to FIG. 11, a first layer 120 is formed over seed layer 118 and in recesses 142 and 144. In some embodiments, first layer 120 may comprise a conductive material, for example a metal. First layer 120 may comprise a noble metal, such as ruthenium, rhodium, palladium, silver, osmium, iridium, platinum, gold, or a combination thereof. Noble metals may be advantageous due to the ability to resist oxidation and/or corrosion. First layer 120 may be deposited, for example using CVD. In other embodiments first layer 120 may be deposited using PVD, ALD, PECVD, or the like.

The deposition process of first layer 120 may continue until the first layer 120 fills and/or overflows recesses 142 and 144 of regions 110 and 112. The deposition process may also terminal before the recesses are filled, as shown in recess 144 of region 114. After the deposition process, first layer 120 may have a non-planar upper surface including one or more peaks and one or more valleys, where valleys in the upper surface correspond to recesses 142 or 144 in dielectric layer 106.

As shown in FIG. 11, region 110, which comprises relatively narrow recess openings compared to regions 112 and 114, may be filled with first layer 120 until first layer 120 overflows recesses 142 and 144 and extends a distance D1 over the top surface of dielectric layer 106. In some embodiments, D1 may be about 10 Å to about 3000 Å, such as about 300 Å. Region 112, which may comprise a recess opening that is relatively wider compared to the recess of region 110 and relatively narrower compared to the recess of region 114, may be filled with first layer 120 until first layer 120 overflows recess 142 and extends a distance D2 over the top surface of dielectric layer 106. D2 may be smaller than D1. In some embodiments, D2 may be about 10 Å to about 3000 Å, such as about 250 Å. Region 114 may comprise a recess opening that is relatively wider compared to regions 110 and 112. Region 114 may comprise a recess that may be only partly filled with first layer 120. First layer 120 may also be deposited on an upper surface of dielectric layer 106 in conductive feature 114, and may extend a distance D3 over the top surface of dielectric layer 106. D3 may be smaller than D1 and D2. In some embodiments, D3 may be about 10 Å to about 3000 Å, such as about 200 Å.

Referring to FIG. 12, a second layer 122 is formed over first layer 120. In some embodiments, second layer 122 is deposited, for example using PVD. In other embodiments, second layer 122 may be deposited using CVD, ALD, PECVD, or the like. Second layer 122 may include a material that is relatively less expensive than a material used to form first layer 120. Second layer 122 may include a material that is relatively easier to CMP using a weak oxidizer than a material used to form first layer 120. In some embodiments, second layer 122 may include a dielectric material, a metal nitride, a metal whose oxide is soluble in slurry (e.g., a slurry used in a CMP process), or a combination thereof. For example, second layer 122 may comprise Co, Cu, Al, TiN, TaN, $SiO_2$, SiN, the like, or a combination thereof in accordance with some embodiments. Second layer 122 may be selected at least in part in dependence upon the material composition of first layer 120. For example, second layer 122 may be selected to avoid or minimize corrosion at an interface of first layer 120 and second layer 122.

In some embodiments, second layer 122 may be formed to a same height in each of regions 110, 112, and 114. Second layer 122 may be formed to thickness T1 in region 110, where T1 is about 0 Å to about 10000 Å, such as about 1500 Å. T1 may be measured from a topmost surface of first layer 120 in region 110. Second layer 122 may be formed to thickness T2 in region 112, where T2 is about 0 Å to about 10000 Å, such as about 1500 Å. T2 may be measured from a topmost surface of first layer 120 in region 112. Second layer 122 may be formed to thickness T3 in region 110, where T3 is about 0 Å to about 10000 Å, such as about 1000 Å. T3 may be measured from a topmost surface of first layer 120 in region 114. In some embodiments, T1 is less than both T2 and T3, T2 is greater than T1 but less than T3, and T3 is greater that each of T1 and T2. In some embodiments, while second layer 122 does not extend into a recess in dielectric layer 106 in region 110 or 112, in region 114 second layer 122 penetrates at least partly into recess 144 and overflows recess 144 (recesses 142 and 144 are shown in FIG. 11).

Figure 13:
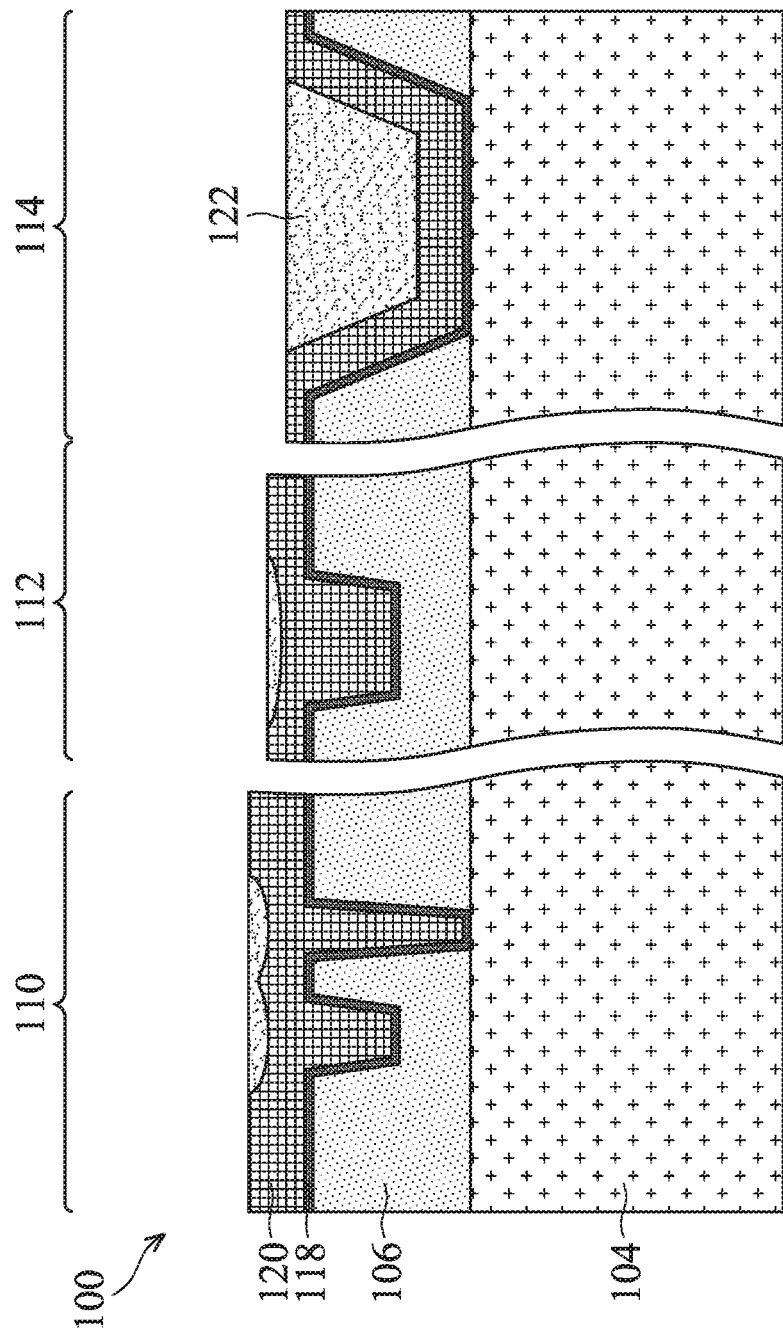

Referring to FIG. 13, one or more first CMP processes are performed on semiconductor device 100. In some embodiments, each of regions 110, 112, and/or 114 may undergo separate first CMP processes. In other embodiments, each of regions 110, 112, and/or 114 may undergo a same first CMP process. Because the first one or more CMP processes is substantially a CMP of the second layer 120, a weak oxidizer may be used to efficiently perform the CMP process(es). For example, an $H_2O_2$ oxidizer may be used. The use of a strong oxidizer, such as $IO_4$ or $CLO_4$ may be avoided, and manufacturing safety may be improved.

The one or more first CMP processes may continue until the first layer 120 is detected. Because of the non-planar nature of the upper surface of first layer 120, when the first layer 120 is detected in the first one or more CMP processes and the first one or more CMP processes terminate, portions of second layer 122 may remain in regions 100 and 112. The resulting structure is shown in FIG. 13. Because of the varying heights of first layer 120 between regions 110, 112, and 114 (see discussion above regarding FIG. 11), after the first one or more CMP processes, the combined thicknesses of first layer 120 and second layer 122 may also vary between regions 110, 112, and 114. In accordance with some embodiments, the combined thickness of first layer 120 and second layer 122 in each of regions 110, 112, and 114 after the first one or more CMP processes is substantially the same as, or corresponds to, the thickness of first layer 120 after the first layer 120 is deposited, where the thickness of the first layer 120 after it is deposited is measured from a peak of first layer 120 to an opposite surface of first layer 120.

Figure 14:
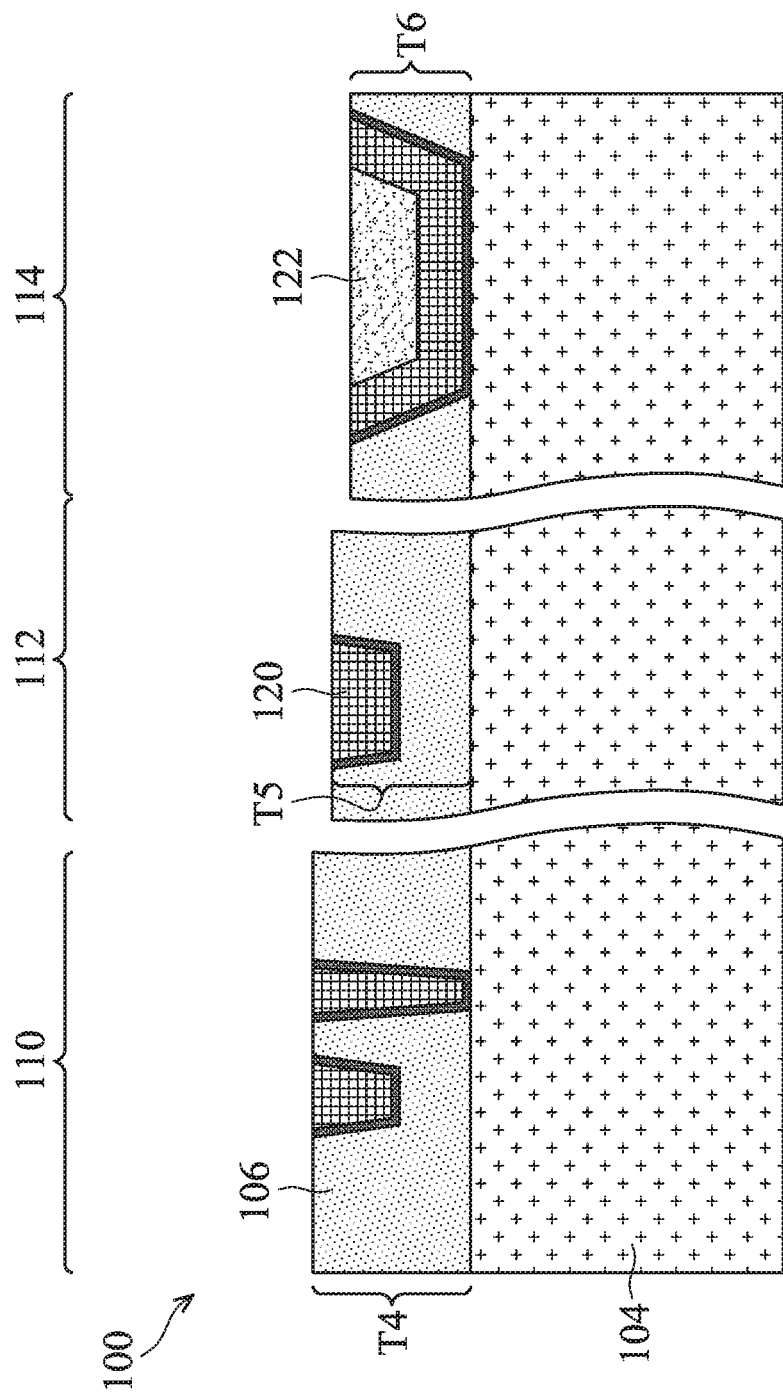

Referring to FIG. 14, an optional second one or more CMP processes may be performed in each of regions 110, 112, and 114. In some embodiments, each of regions 110, 112, and/or 114 may undergo separate second CMP processes. In other embodiments, each of regions 110, 112, and/or 114 may undergo a same second CMP process. The second one or more CMP processes may remove the remaining portions of seed layer 118, first layer 120 and second layer 122 that overflow the recesses 142 and 144 in dielectric layer 106. The second one or more CMP processes may use a relatively weak oxidizer, such as $H_2O_2$, which results in a safer manufacturing process. Although portions of the first layer 120 may be removed in the second one or more CMP processes, because the amount of first layer 120 that is being removed is relatively small, a weak oxidizer may be used without the time of the second one or more CMP processes becoming prohibitively long.

In some embodiments, an endpoint of the second one or more CMP processes may be determined according to an elapsed time of the second one or more CMP processes. In embodiments in which an endpoint of the second one or more CMP processes is determined by time, after the second one or more CMP processes terminate, a thickness of dielectric layer 106, a thickness of first layer 120, and/or a combined thickness of first layer 120 and second layer 120 may vary in region 110, region 112, and/or region 114. The thickness of dielectric layer 106, first layer 120, and/or a combined thickness of first layer 120 and second layer 122 may vary in region 110, region 112, and region 114 according to the initial variance in thicknesses, for example as discussed above in connection with FIG. 13. The resulting structure is shown in FIG. 14. In some embodiment, a thickness of dielectric layer 106 and first layer 120 in region 110 is respectively thickness T4, wherein T4 is about 50 Å to about 1000 Å, such as about 400 Å. In some embodiments, a thickness of dielectric layer 106 in region 112 is thickness T5, where T5 is about 50 Å to about 1000 Å, such as about 350 Å. In some embodiments, a thickness of dielectric layer 106, and/or a combined thickness of first layer 120 and second layer 122 in region 114 is thickness T6, where T6 is about 50 Å to about 1000 Å, such as about 300 Å. In some embodiments, T4 is greater than both T5 and T6, T5 is greater than T6 and less than T4, and T6 is less than each of T4 and T5.

In other embodiments, the second one or more CMP processes may terminate upon the detection of an endpoint. For example, the second one or more CMP processes may terminate upon detection of the dielectric layer 106. In embodiments in which the the second one or more CMP processes terminate upon the detection of an endpoint, the combined thickness of dielectric layer 106, first layer 120, and second layer 122 may be substantially the same in in region 110, region 112, and region 114 (not shown in FIG. 14).

Figure 15:
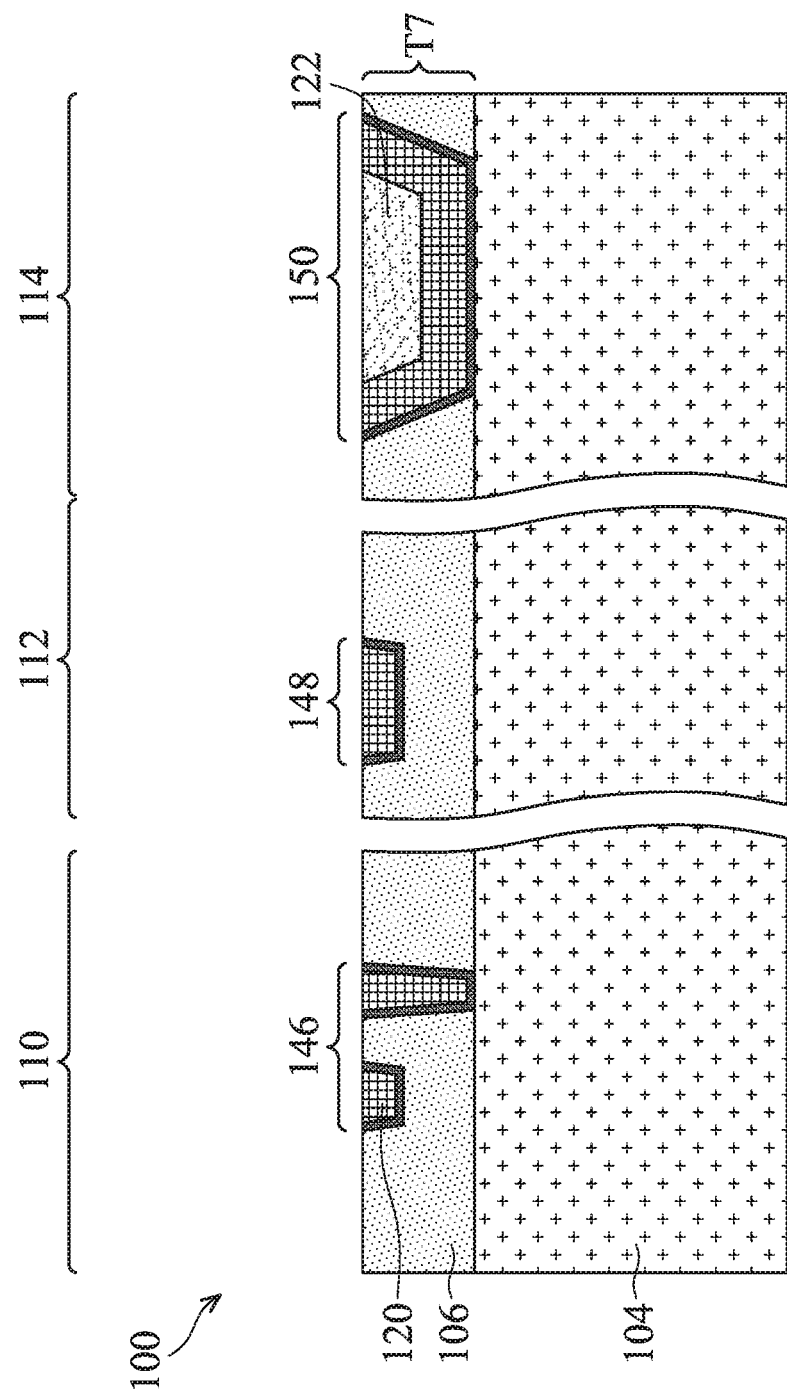

Referring to FIG. 15, a third one or more CMP processes is performed in each of regions 110, 112, and 114 to thin the first layer 120, second layer 122, and dielectric layer 106 to a target thickness. In some embodiments, each of regions 110, 112, and/or 114 may undergo separate third CMP processes. In other embodiments, each of regions 110, 112, and/or 114 may undergo a same third CMP process. In regions 110 and 112, the third one or more CMP processes may remove remaining portions of seed layer 118, first layer 120, and dielectric layer 106. In region 114, the third one or more CMP processes may remove remaining portions of seed layer 118, first layer 120, second layer 120, and dielectric layer 106. The third one or more CMP processes may use a relatively weak oxidizer, such as $H_2O_2$, which results in a safer manufacturing process. Although portions of the first layer 120 may be removed in the second one or more CMP processes, because the amount of first layer 120 that is being removed is relatively small, a weak oxidizer may be used without the time of the second one or more CMP processes becoming prohibitively long.

The third one or more CMP processes may continue for a designated elapsed time, after which dielectric layer 106 and first layer 120 (and second layer 122 if applicable) are at a target thickness. In some embodiments, after the third one or more CMP processes are complete, a thickness of dielectric layer 106 and first layer 120 (and second layer 122 if applicable) have substantially a same thickness T7. In some embodiments, T7 is about 50 Å to about 800 Å, such as about 200 Å. The resulting structure is shown in FIG. 15. A conductive feature 146 has been formed in region 110, a conductive feature 148 has been formed in region 112, and a conductive feature 150 has been formed in region 114. In some embodiments, conductive feature 146 is an SRAM device, conductive feature 148 is a logic device, and conductive feature 150 is a seal ring.

Figure 16:
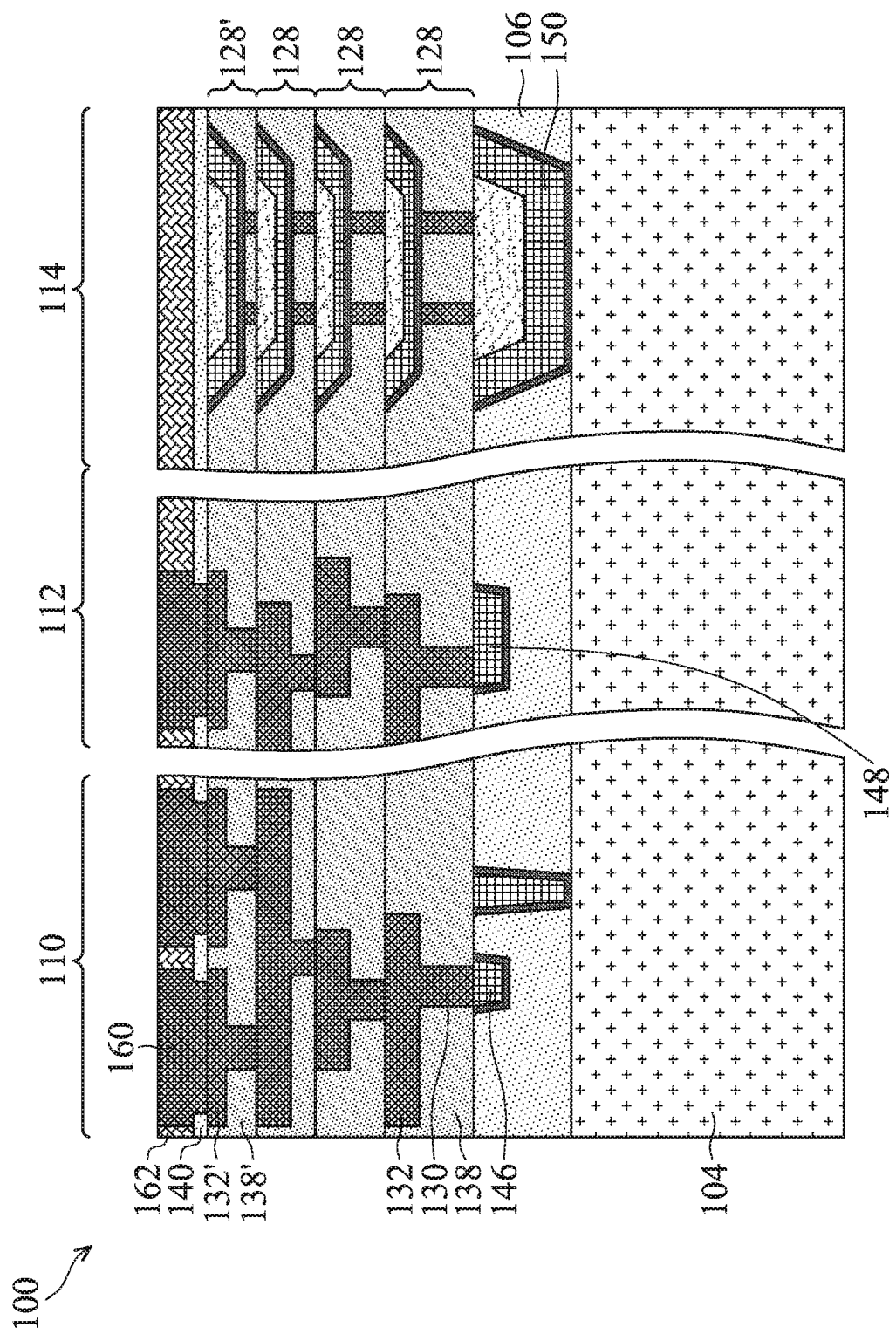

In subsequent processing, additional interconnect layers, such as interconnect layers 128 and/or additional seal rings 150, may be formed over dielectric layer 106, as shown in FIG. 16. As shown in FIG. 16, interconnect layers 128 may include conductive lines 132, vias 130, and dielectric layer 138. Conductive lines 132 and/or vias 130 may be formed to electrically and/or physically connect to conductive feature 146, conductive features 148, and/or conductive feature 150. In some embodiments, conductive lines 132 and/or vias 130 may connect one or more of conductive feature 146, conductive features 148, and/or conductive feature 150 to each other or to external components. In some embodiments, conductive lines 132 and/or vias 130 may connect conductive feature 146, conductive features 148, and/or conductive feature 150 to a power node or to a ground node.

In an embodiment vias 130 and conductive lines 132 may be formed using, e.g., a dual damascene process, whereby an opening for both vias 130 and conductive lines 132 in a given interconnect layer 128 are formed within a respective dielectric layer, such as dielectric layer 138. In an embodiment dielectric layer 138 is formed on dielectric layer 106. In some embodiments, dielectric layer 138 is formed of a polymer, which may be a photo-sensitive material such as polybenzoxazole (PBO), polyimide, benzocyclobutene (BCB), a combination thereof, or the like, that may be patterned using lithography. In other embodiments, dielectric layer 138 is formed of a nitride such as silicon nitride, an oxide such as silicon oxide, PhosphoSilicate Glass (PSG), BoroSilicate Glass (BSG), Boron-doped PhosphoSilicate Glass (BPSG), or the like. Dielectric layer 106 may be formed by spin coating, lamination, chemical vapor deposition (CVD), or the like.

Openings for conductive lines 132 and vias 130 may be formed by placing and patterning a photoresist material over the dielectric layer 138. Once the photoresist material has been placed and patterned, a dry etch process such as a reactive ion etch may be utilized to transfer the pattern from the patterned photoresist to the underlying dielectric layer 138. This process may be repeated to form both the via portion of the opening and the trench portion of the opening.

Once the opening has been formed, the opening may be filled with a conductive material in order to form vias 130 and conductive lines 132 within dielectric layer 138. In an embodiment the formation of the conductive material may be initiated by first depositing a barrier layer (not separately illustrated in FIG. 16). The barrier layer may be a barrier material such as titanium nitride or tantalum nitride which may be deposited using a deposition process such as chemical vapor deposition, physical vapor deposition, atomic layer deposition, or the like. However, any suitable material or method of deposition may be utilized to form the barrier layer.

Once the barrier layer has been formed, a conductive material may be deposited to fill and/or overfill the openings within dielectric layer 138. In an embodiment the conductive material may be a material such as copper, tungsten, ruthenium, titanium dioxide, a combination thereof, or the like, formed, e.g., using a seed layer (not shown) and a plating process, such as electrochemical plating, although other processes of formation, such as sputtering, evaporation, or a PECVD process, may alternatively be used depending upon the desired materials. Once the openings have been filled with conductive material, any excess conductive material outside of the openings may be removed, and conductive lines 132 and dielectric layer 138 may be planarized using, for example, a chemical mechanical polishing process. The above processes may be repeated as necessary in order to form a number of interconnect lines that is required for a particular package design, for example as shown in FIG. 16.

As shown in FIG. 16, in some embodiments multiple conductive features 150 may be formed in a plurality of interconnect layers 128. The same or similar processes as those described above in connection with the formation of conductive feature 150 in dielectric layer 106 may be repeated to form additional conductive features 150 in interconnect layers 128.

In some embodiments, die connectors 160 are formed over the interconnect layers 128. The die connectors 160 are respectively coupled to a respective uppermost conductive line 132' that is farthest from substrate 142. Die connectors 160 may provide external electrical connections to semiconductor device 100. A passivation film 140 is on uppermost dielectric layer 138' and on portions of the respective uppermost conductive lines 132' to which the die connectors 160 are respectively coupled. Openings through the passivation film 140 are made to the respective uppermost conductive lines 132' to which the die connectors 160 are respectively coupled. Die connectors 160, such as conductive pillars (for example, comprising a metal such as copper), are in the openings through passivation film 140 and are mechanically and electrically coupled to the respective uppermost conductive line 132 to which the respective die connectors 160 are respectively coupled. The die connectors 160 may be formed by, for example, plating or the like. The die connectors 160 may be electrically coupled to one or more of the respective conductive features of regions 110, 112, and 114.

A dielectric material 162 is on the passivation film 140 and sidewalls of the die connectors 160. The dielectric material 162 laterally encapsulates the die connectors 160, and the dielectric material 162 is laterally coterminous with the substrate 104. The dielectric material 162 may be a polymer such as PBO, polyimide, BCB, or the like; a nitride such as silicon nitride or the like; an oxide such as silicon oxide, PSG, BSG, BPSG, or the like; the like, or a combination thereof, and may be formed, for example, by spin coating, lamination, CVD, or the like.

In other embodiments, die connectors 160 may not be formed. Instead, an under bump metallization (UBM) (not shown in FIG. 16) may be formed and patterned over an uppermost interconnect layer 128' in accordance with some embodiments, thereby forming an electrical connection with an uppermost conductive line 132. The UBM provides an electrical connection upon which an electrical connector, e.g., a solder ball/bump, a conductive pillar, or the like, may be placed. In an embodiment, the UBM includes a diffusion barrier layer, a seed layer, or a combination thereof. The diffusion barrier layer may include Ti, TiN, Ta, TaN, or combinations thereof. The seed layer may include copper or copper alloys. However, other metals, such as nickel, palladium, silver, gold, aluminum, combinations thereof, and multi-layers thereof, may also be included. In an embodiment, UBM is formed using sputtering. In other embodiments, electro plating may be used.

Connectors (not shown) may be formed over the under bump metallization in accordance with some embodiments. The connectors may be solder balls, metal pillars, controlled collapse chip connection (C4) bumps, micro bumps, electroless nickel-electroless palladium-immersion gold technique (ENEPIG) formed bumps, combination thereof (e.g., a metal pillar having a solder ball attached thereof), or the like. The connectors may include a conductive material such as solder, copper, aluminum, gold, nickel, silver, palladium, tin, the like, or a combination thereof. In some embodiments, the connectors comprise a eutectic material and may comprise a solder bump or a solder ball, as examples. The solder material may be, for example, lead-based and lead-free solders, such as Pb—Sn compositions for lead-based solder; lead-free solders including InSb; tin, silver, and copper (SAC) compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free connectors such as solder balls may be formed from SnCu compounds as well, without the use of silver (Ag). Alternatively, lead-free solder connectors may include tin and silver, Sn—Ag, without the use of copper. The connectors may form a grid, such as a ball grid array (BGA). In some embodiments, a reflow process may be performed, giving the connectors a shape of a partial sphere in some embodiments. Alternatively, the connectors may comprise other shapes. The connectors may also comprise non-spherical conductive connectors, for example.

In some embodiments, the connectors comprise metal pillars (such as a copper pillar) formed by a sputtering, printing, electro plating, electroless plating, CVD, or the like, with or without a solder material thereon. The metal pillars may be solder free and have substantially vertical sidewalls or tapered sidewalls.

As described herein, in accordance with some embodiments conductive features may be formed using a two layer process. A first layer may be formed using a conductive material that will be used in conductive features that are formed in a dielectric layer. The first layer may be deposited in recesses of the dielectric layer so that the recesses are filled or partly filled. Next, a second layer is formed over the first layer to a desired thickness. The second layer may be relatively inexpensive and relatively easy to thin using a CMP process compared to first layer. As such, during a subsequent CMP process, at least a portion of the material being thinned is the second layer instead of the first layer. As such, the waste material that is generated is relatively inexpensive, and the CMP process may proceed at a relatively faster pace using only a weak oxidizer, which makes the manufacturing process safer.

A method is provided in accordance with some embodiments. The method includes forming a dielectric layer over a substrate. The method also includes patterning the dielectric layer to form a first recess. The method also includes depositing a first layer in the first recess. The method also includes depositing a second layer over the first layer, the second layer being different than the first layer. The method also includes performing a first chemical mechanical polish (CMP) process on the second layer using a first oxidizer, the first CMP process terminating upon detection of an endpoint. The method also includes, after performing the first CMP, performing a second CMP process on the second layer and the first layer using the first oxidizer. The method also includes forming a first conductive element over remaining portions of the first layer after the second CMP polish is performed. In an embodiment the first layer comprises ruthenium. In an embodiment the first oxidizer comprises $H_2O_2$. In an embodiment the detection of the endpoint comprises detection of the first layer. In an embodiment the first layer overfills the first recess and extends along a top surface of the dielectric layer after it is deposited. In an embodiment the method also includes performing a third CMP process after the first CMP process and before the second CMP polish, where the third CMP removes portions of the first layer that extend along the top surface of the dielectric layer. In an embodiment the method includes patterning the dielectric layer to form a second recess, depositing the first layer in the second recess, depositing the second layer in the second recess, and forming a second conductive element over remaining portions of the first layer and the second layer in the second recess after the second CMP polish is performed. In an embodiment, after the first one or more CMP processes, a combined height of the first layer and the second layer over the dielectric layer adjacent to the first recess is greater than a combined height of the first layer and the second layer over the dielectric layer adjacent to the second recess. In an embodiment the method includes patterning the dielectric layer to form a third recess; and depositing the first layer in the third recess, where the first recess is adjacent to the second recess, and the second recess is adjacent to the third recess. In an embodiment, after the second CMP process, the second layer extends in the third recess, and the second layer does not extend in the first recess or the second recess. In an embodiment an endpoint of the second CMP process is determined according to an elapsed time of the second CMP process.

A method is provided in accordance with some embodiments. The method may include patterning a first dielectric layer to form a first recess and a second recess. The method may also include depositing a first layer in the first recess and the second recess, where the first layer extends along an upper surface of the first dielectric layer between the first recess and the second recess, and where an upper surface of the first layer comprises a peak and a valley. The method may also include depositing a second layer over the first layer. The method may also include performing a first chemical mechanical polish (CMP) process, wherein the first CMP process terminates upon detection of the peak of the upper surface of the first layer. The method may also include performing a second CMP process on the first layer, wherein the second CMP process terminates after a first predetermined time. The method may also include performing a third CMP process on the first layer, wherein the third CMP process terminates after a second predetermined time. In an embodiment the first layer comprises a noble metal. In an embodiment the first layer comprises ruthenium. In an embodiment the first recess is adjacent to the second recess. In an embodiment, after the first CMP process a combined thickness of the dielectric layer, the first layer and the second layer is greater in a first region than in a second region, where the first region is adjacent to the first recess and the second region is adjacent to the second recess. In an embodiment, after the second CMP process the combined thickness of the dielectric layer, the first layer and the second layer is greater in the first region than in the second region.

A device is provided in accordance with some embodiments. The device includes a substrate. The device also includes a dielectric layer over the substrate. The device also includes a first conductive feature in the dielectric layer, the first conductive feature comprising a first material. The device also includes a second conductive feature in the dielectric layer adjacent to the first conductive feature, the second conductive feature comprising a second material over the first material. The device also includes an electrical connector overlying the first conductive feature and/or the second conductive feature. In an embodiment the first material is ruthenium. In an embodiment a virtual line that passes through the second conductive feature in a direction that is parallel to a major surface of the substrate sequentially passes through the first material, the second material, and the first material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a dielectric layer over a substrate;
   patterning the dielectric layer to form a first recess;
   patterning the dielectric layer to form a second recess;
   depositing a seed layer in the first recess;
   depositing a first layer over the seed layer in the first recess;
   depositing the first layer in the second recess;
   depositing a second layer over the first layer, the second layer being different than the first layer;
   depositing the second layer in the second recess;
   performing a first chemical mechanical polish (CMP) process on the second layer using a first oxidizer, the first CMP process terminating upon detection of an endpoint;
   after performing the first CMP, performing a second CMP process on the second layer, the first layer, and the seed layer using the first oxidizer;
   forming a first conductive element over remaining portions of the first layer after the second CMP polish is performed; and
   forming a second conductive element over the remaining portions of the first layer and the second layer in the second recess after the second CMP polish is performed.

2. The method according to claim 1, wherein the first layer comprises ruthenium.

3. The method according to claim 1, wherein the first oxidizer comprises $H_2O_2$.

4. The method according to claim 1, wherein the detection of the endpoint comprises detection of the first layer.

5. The method according to claim 1, wherein the first layer and the seed layer fill all of the first recess and the first layer extends along a top surface of the dielectric layer after it is deposited.

6. The method according to claim 5, further comprising performing a third CMP process after the first CMP process and before the second CMP polish, wherein the third CMP removes portions of the first layer that extend along the top surface of the dielectric layer.

7. The method according to claim 1, wherein after the first one or more CMP processes, a combined height of the first layer and the second layer over the dielectric layer adjacent to the first recess is greater than a combined height of the first layer and the second layer over the dielectric layer adjacent to the second recess.

8. The method according to claim 1, further comprising:
patterning the dielectric layer to form a third recess; and
depositing the first layer in the third recess;
wherein the first recess is adjacent to the second recess, and the second recess is adjacent to the third recess.

9. The method according to claim 8, wherein after the second CMP process, the second layer extends in the third recess, and wherein the second layer does not extend in the first recess or the second recess.

10. The method according to claim 1, wherein an endpoint of the second CMP process is determined according to an elapsed time of the second CMP process.

11. A method, comprising:
patterning a first dielectric layer to form a first recess and a second recess;
depositing a first layer in the first recess and the second recess, wherein the first layer extends along an upper surface of the first dielectric layer between the first recess and the second recess, and wherein an upper surface of the first layer comprises a peak and a valley;
depositing a second layer over the first layer;
performing a first chemical mechanical polish (CMP) process, wherein the first CMP process terminates upon detection of the peak of the upper surface of the first layer;
performing a second CMP process on the first layer, wherein the second CMP process terminates after a first predetermined time; and
performing a third CMP process on the first layer, wherein the third CMP process terminates after a second predetermined time.

12. The method according to claim 11, wherein the first layer comprises a noble metal.

13. The method according to claim 12, wherein the first layer comprises ruthenium.

14. The method according to claim 11, wherein the first recess is adjacent to the second recess.

15. The method according to claim 11, wherein after the first CMP process a combined thickness of the first dielectric layer, the first layer and the second layer is greater in a first region than in a second region, wherein the first region is adjacent to the first recess and the second region is adjacent to the second recess.

16. The method according to claim 15, wherein after the second CMP process the combined thickness of the dielectric layer, the first layer and the second layer is greater in the first region than in the second region.

17. The method according to claim 11, wherein the second layer does not extend in the first recess or the second recess after it is deposited.

18. A method, comprising:
forming a dielectric layer over a substrate;
patterning the dielectric layer to form a first recess and a second recess, wherein a depth of the first recess is larger than a depth of the second recess;
depositing a first material in the first recess and the second recess;
forming a second material over the first material, wherein after the second material is formed the first recess is filled by the first material and the second material and the second material does not extend into the second recess;
performing a plurality of planarization processes on the first material and the second material; and
after performing the plurality of planarization processes on the first material and the second material, forming a plurality of conductive elements over remaining portions of the first material and the second material.

19. The method according to claim 18, wherein the first material comprises ruthenium.

20. The method according to claim 18, wherein the first material comprises a noble metal.

* * * * *